United States Patent [19]

Nakamura et al.

[11] Patent Number: 5,166,082
[45] Date of Patent: Nov. 24, 1992

[54] BIMOS TRANSISTOR DEVICES HAVING BIPOLAR AND MOS TRANSISTORS FORMED IN SUBSTRATE THEREOF AND PROCESS FOR THE FABRICATION OF THE SAME

[75] Inventors: Takaharu Nakamura; Toshikazu Kuroda; Tatsuya Kimura, all of Tokyo, Japan

[73] Assignee: Oki Electric Industry Co., Ltd., Tokyo, Japan

[21] Appl. No.: 712,713

[22] Filed: Jun. 10, 1991

[30] Foreign Application Priority Data

Jun. 13, 1990 [JP] Japan .................................. 2-152722

[51] Int. Cl.⁵ ...................... H01L 21/70; H01L 27/00
[52] U.S. Cl. ......................................... 437/31; 437/59; 148/DIG. 8; 148/DIG. 9; 257/378
[58] Field of Search ...................... 437/59, 31; 357/43; 148/DIG. 8, DIG. 9

[56] References Cited

U.S. PATENT DOCUMENTS 4,443,932  4/1984  Mastroianni et al. .................. 437/51
4,868,135  9/1989  Ogura et al. .......................... 357/43

FOREIGN PATENT DOCUMENTS 0251749  10/1989  Japan ..................................... 357/43
0066157   3/1991  Japan ..................................... 357/43

OTHER PUBLICATIONS

Liou et al, "A Single-Poly CMOS Process Merging Analog Capacitors, Bipolar and EPROM Devices", 1989 Symposium on VLSI Technology, Kyoto, Japan (May 22-25, 1989).

Primary Examiner—Olik Chaudhuri
Assistant Examiner—Long Pham
Attorney, Agent, or Firm—Wenderoth, Lind & Ponack

[57] ABSTRACT

This invention provides devices each of which has at least one bipolar transistor and at least one MOS transistor, both formed on a substrate. This invention also provides their fabrication process. Each device is constructed of epitaxial layers of a first and second conductivity types, surfaces of said epitaxial layers being partly exposed, at least one MOS transistor formed in the epitaxial layer of the first conductivity type, and at least one bipolar transistor formed in the epitaxial layer of the second conductivity type. Its fabrication process comprises the steps of forming the epitaxial layer of the second conductivity type on the semiconductor substrate, forming the epitaxial layer of the first conductivity type on a part of the epitaxial layer of the second conductivity type, forming the bipolar transistor in the epitaxial layer of the second conductivity type and then forming the MOS transistor in the epitaxial layer of the first conductivity type.

12 Claims, 12 Drawing Sheets

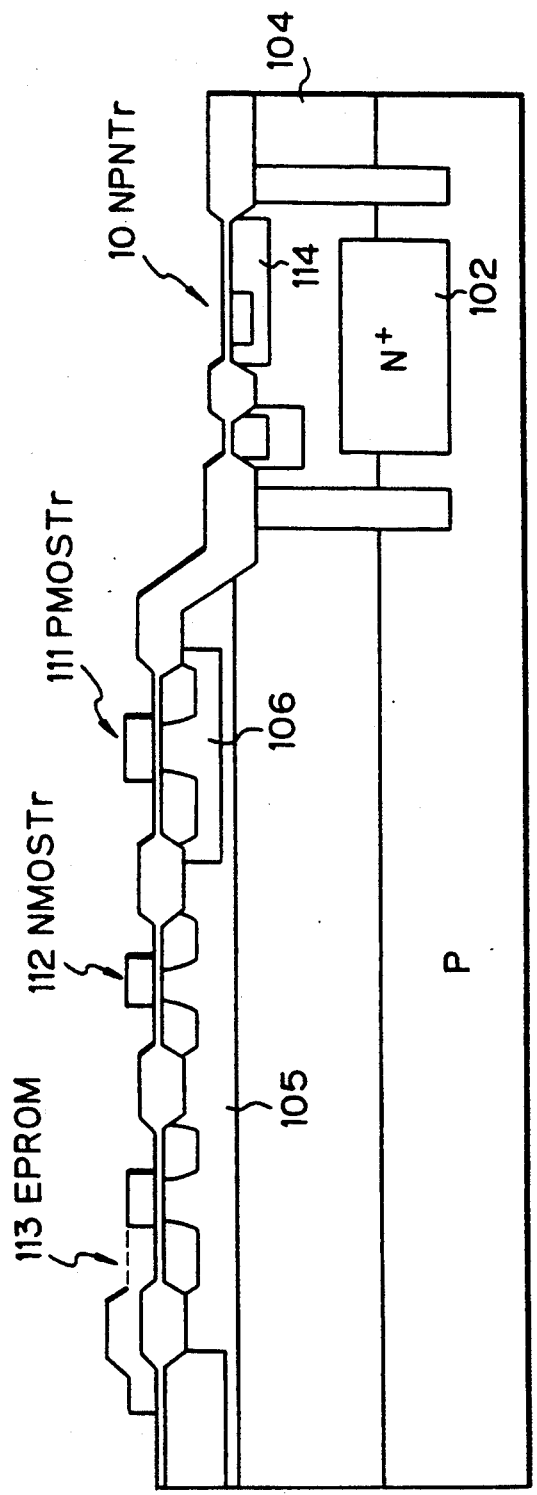

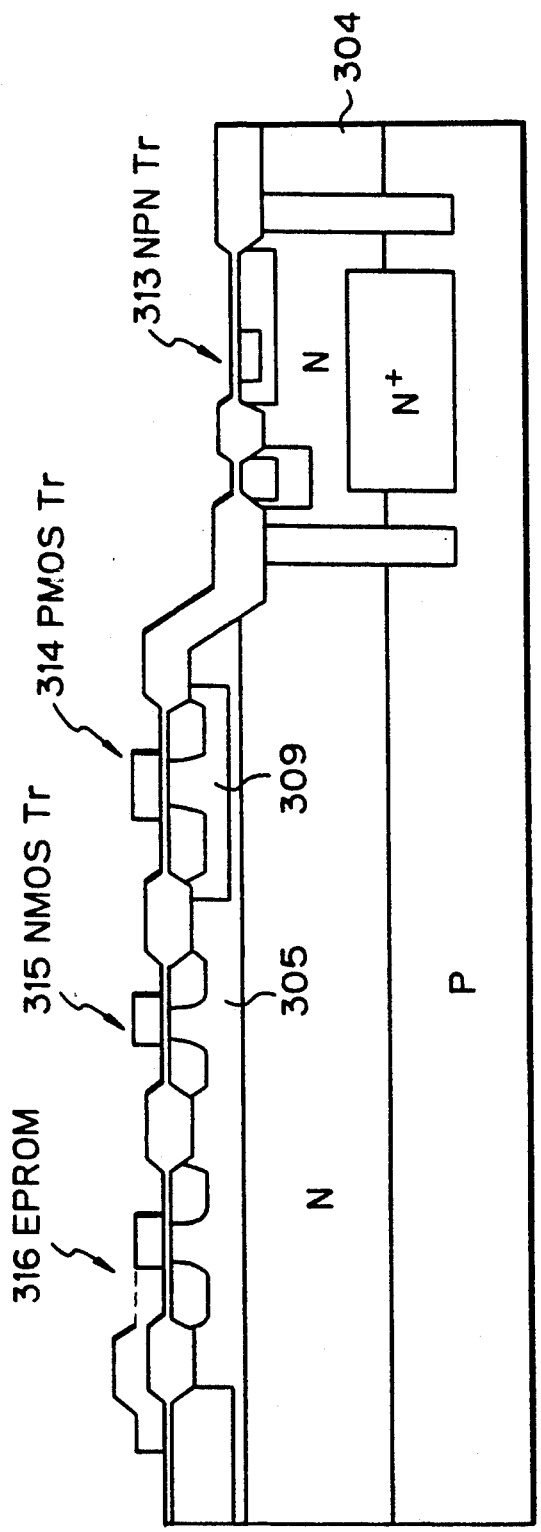

BIMOS TRANSISTOR DEVICES HAVING BIPOLAR AND MOS TRANSISTORS FORMED IN SUBSTRATE THEREOF AND PROCESS FOR THE FABRICATION OF THE SAME

BACKGROUND OF THE INVENTION

Devices with bipolar and MOS transistors formed on a semiconductor substrate are disclosed, for example on pages 37-38 of "1989 Symposium on VLSI Technology".

These devices individually have at least one MOS transistor and at least one bipolar transistor in a P-type epitaxial layer which is formed on a semiconductor substrate. A region of the epitaxial layer, in which the bipolar transistor is formed, contains a well layer electrically isolating the MOS transistor and the bipolar transistor from each other.

SUMMARY OF THE INVENTION

An object of the present invention is to provide a device with bipolar and MOS transistors formed on a substrate and also a fabrication process therefor.

A device according to the present invention is constructed of a semiconductor substrate of a first conductivity, an epitaxial layer of a second conductivity type and another epitaxial layer of the first conductivity type, a bipolar transistor formed in a first region of the epitaxial layer of the second conductivity type, and a MOS transistor formed in a second region of the epitaxial layer of the first conductivity. The epitaxial layers are formed on the semiconductor substrate and are partially exposed at surfaces thereof. The first region includes a part of the exposed surface of the epitaxial layer of the second conductivity type and is located adjacent to said part of the exposed surface of the epitaxial layer of the second conductivity type. The second region includes a part of the exposed surface of the epitaxial layer of the first conductivity type and is located adjacent to said part of the exposed surface of the epitaxial layer of the first conductivity type.

To reduce the number of heating steps required for the formation of the structure described above, a fabrication process according to the present invention comprises the following steps: forming a heavily-doped, buried layer of a second conductivity type in a first region of the semiconductor substrate, said first region including a part of the major surface and being located adjacent to said part of said major surface; forming an epitaxial layer of the second conductivity type on the semiconductor substrate, including causing the buried layer of the second conductivity type to extend close to the major surface of the semiconductor substrate inside the epitaxial layer of the second conductivity type; forming an epitaxial layer of a first conductivity type on the epitaxial layer of the second conductivity type; exposing a surface of the epitaxial layer of the second conductivity type, said surface being located right above the first region; forming said at least one bipolar transistor in a second region of the epitaxial layer of the second conductivity type, said second region including said surface of said epitaxial layer and being located adjacent to said surface of said epitaxial layer of the second conductivity type; and forming said at least one MOS transistor in a third region of the epitaxial layer of the first conductivity type, said third region including a part of a surface of the epitaxial layer of the first conductivity type and being located adjacent to the part of the surface of the epitaxial layer of the first conductor.

As is apparent from the foregoing, the device according to the present invention contains, in the bipolar-transistor-forming region, no well layer which would otherwise be required to electrically isolate the bipolar transistor and the MOS transistor from each other. This invention therefore makes it possible to omit the heat treatment step for the formation of such a well layer. This can reduce upward diffusion of the buried layer positioned underneath the bipolar transistor so that the reduction in withstandable voltage of the bipolar transistor can be minimized.

BRIEF DESCRIPTION OF THE DRAWINGS

FIGS. 1(a) to 1(g) are cross sections showing fabrication steps according to a first example of the present invention;

FIGS. 3(a) to 3(h) are cross sections depicting fabrication steps according to a third example of the present invention.

DESCRIPTION OF THE PREFERRED EMBODIMENTS

Referring first to FIGS. 1(a) to 1(g), the fabrication steps according to the first example of the present invention will be described.

Figure 1A:
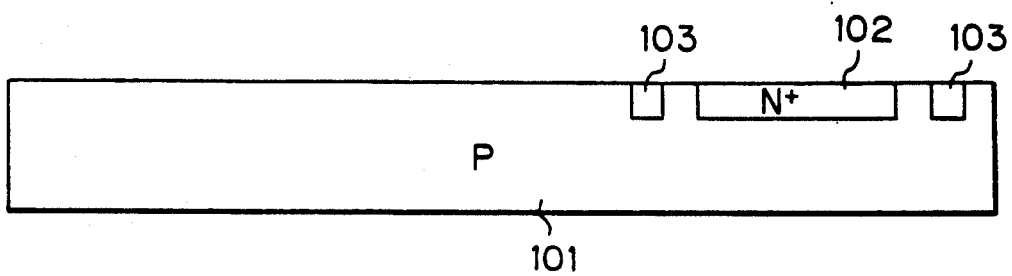

As is depicted in FIG. 1(a), a P-type <100> Si substrate 101 having a resistivity of about 15Ω.cm is provided. This P-type Si substrate 101 is next heat-treated at 1,000° C. for 20 minutes in an $O_2$ atmosphere, whereby an $SiO_2$ film (not shown) of about 450 Å is formed on the entire surface of the P-type Si substrate 101. A resist resin (not illustrated) is coated on the entire surface of the $SiO_2$ film. By a conventional photolithographic process, the resist resin is patterned to expose the surface of the $SiO_2$ film at each area where an NPN transistor is to be formed. Using the thus-patterned resist resin as a mask, antimony ions are introduced into the P-type Si substrate 101 at the acceleration voltage of 40 keV and the dose of 3E 15 ions/$cm^2$ by ion implantation. The resist resin is then stripped off, followed by heat treatment approximately at 1,200° C. for 500 minutes in an $N_2$ atmosphere. This results in the formation of an N+ buried layer 102 in the substrate 101 at the region where the NP transistor is to be formed. The sheet resistance and junction depth of the buried layer 102 are about 30 Ω/□ and 4.5 μm, respectively. A resist resin is coated on the entire surface, and is then patterned by photolithography to expose each region of the substrate 101, said region being intended to serve as an isolation region for an associated NPN transistor. Using the thus-patterned resist resin as a mask, boron ions are introduced into the P-type Si substrate 101 at the acceleration voltage of 60 keV and the dose of 2E 14 ions/$cm^2$ by ion implantation. The resist resin is stripped off and heat treatment is then conducted approximately at 1,080° C. for 30 minutes, whereby P+ buried layers 103 are formed in the P-type Si substrate 101 in the regions which will become isolation regions. The sheet resistance and junction depth of each of the buried layers 103 are about 300 Ω/□ and 1.3 μm, respectively. The $SiO_2$ film on the surface is then wholly stripped off.

Figure 1B:
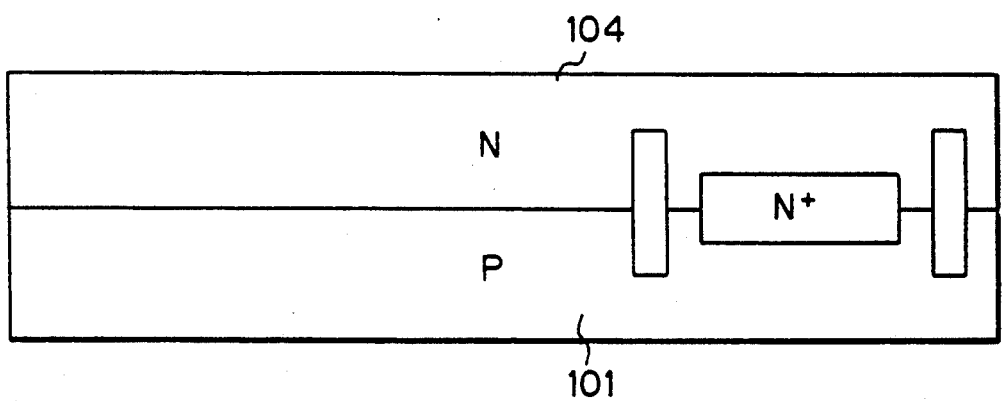

On the entire upper surface of the P-type Si substrate, an N-type epitaxial layer 104 made of N-type silicon and having a resistivity of about 5Ω.cm and a thickness of about 12 μm is formed at 1,000° C. by an epitaxial process in which SiH$_2$Cl$_2$ gas is used. Concurrently with the formation of the N-type epitaxial layer 104, the N+ buried layer 102 and P+ buried layer 103 diffuse into the resulting N-type epitaxial layer 104. The resultant structure is shown in FIG. 1(b).

Figure 1C:
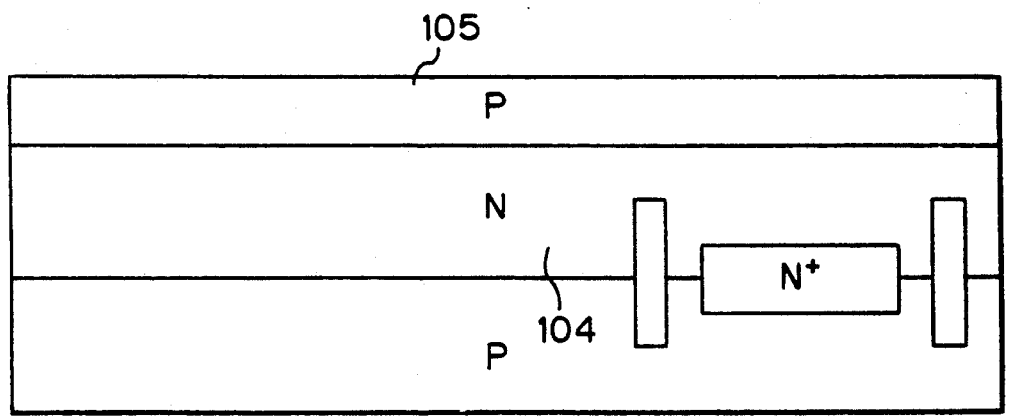

As is shown in FIG. 1(c), a P-type epitaxial layer 105 made of P-type silicon and having a resistivity of about 2Ω.cm and a thickness of about 3 μm is formed on the N-type epitaxial layer 104 by a similar process.

Figure 1D:
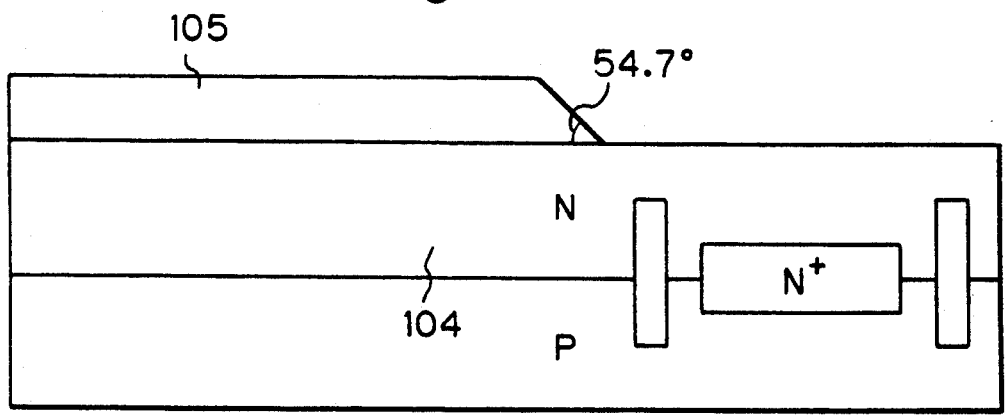

Oxidation is then conducted at about 1,000° C. for about 5 minutes in steam so that an SiO$_2$ film (not illustrated) of about 1,000 Å is formed over the entire surface. By photolithography, a resist resin is patterned so that the SiO$_2$ film is exposed at an area where an NPN transistor is to be formed in the P-type epitaxial layer 105 (including an isolation region therefor). The P-type epitaxial layer 105 which is made of silicon is then etched about 3 μm with an alkaline etchant such as KOH or NaOH while using the thus-patterned resist resin as a mask. Since the etching rate is greater for <100> plane than for other planes such as <111> plane at this time, the P-type epitaxial layer 105 is etched with the inclination of 54.7° relative to the underlying N-type epitaxial layer 104 as shown in FIG. 1(d). The etched depth of 3 μm is needed to completely remove the P-type epitaxial layer 105. This etching makes it possible to remove the P-type epitaxial layer 105 from the NPN-transistor-forming region of the N-type epitaxial layer 105, said region including the isolation regions, so that the P-type epitaxial layer 105 is allowed to remain on the N-type epitaxial layer 104 at the area other than the NPN-transistor-forming region. Because of the inclusion of a subsequent oxidation step, no practical problem or inconvenience will arise even if the P-type epitaxial layer 105 remains to some extent on the NPN-transistor-forming region of the N-type epitaxial layer 104. Even if the N-type epitaxial layer 104 is somewhat overetched, such overetching will cause no substantial problem.

Figure 1E:
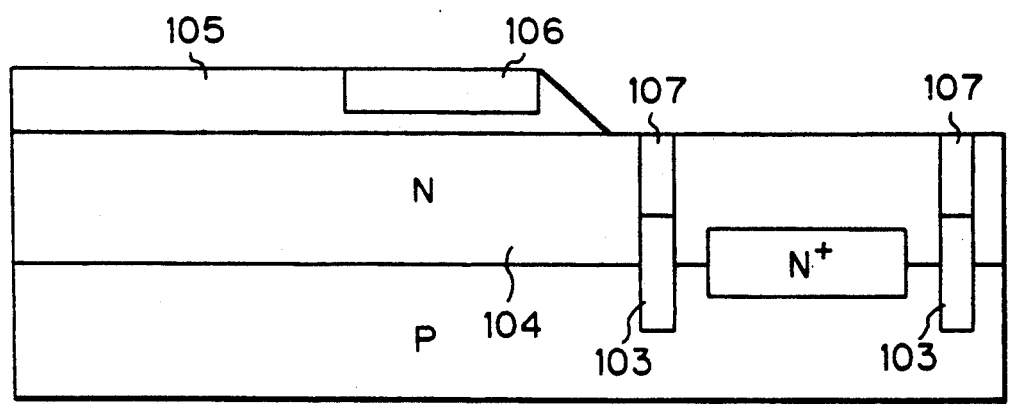

By photolithography, a resist resin was patterned to expose the remaining P-type epitaxial layer 105 at a region where a PMOS transistor is to be formed. Using the thus-patterned resist resin as a mask, phosphorus ions were introduced into the PMOS-transistor-forming region of the P-type epitaxial layer 105 at the acceleration voltage of about 70 keV and the dose of 1E 13 ions/cm$^2$ by ion implantation. The resist resin was then stripped off, followed by the formation of an SiO$_2$ film to about 1,000 Å on the P-type epitaxial layer 105 and the N-type epitaxial layer 104. By photolithography, a resist resin was patterned to expose the NPN-transistor-forming region of the N-type epitaxial layer 104. Using the thus-patterned resist resin as a mask, boron ions were introduced into the NPN-transistor-forming region of the N-type epitaxial layer 104 at the acceleration voltage of about 100 keV and the dose of about 2E 13 ions/cm$^2$ by ion implantation. Heat treatment was then conducted at about 1,200° C. for about 200 minutes in an N$_2$ atmosphere. As a result, as depicted in FIG. 1(e), an N-type well layer 106 is formed in the PMOS-transistor-forming region of the P-type epitaxial layer 105. It is necessary to form the N-type well layer in a manner such that it is not connected to the N-type epitaxial layer 104. Concurrently with the formation of the N-type well layer, a P+ layer 107 is formed in each NPN-transistor-forming region of the N-type epitaxial layer 104 and the P+ layer 107 is connected to the corresponding P+ buried layer 103. As a result, the isolation of the NPN-transistor-forming region is completed. Subsequently, the SiO$_2$ film still remaining on the surface is removed.

Figure 1F:
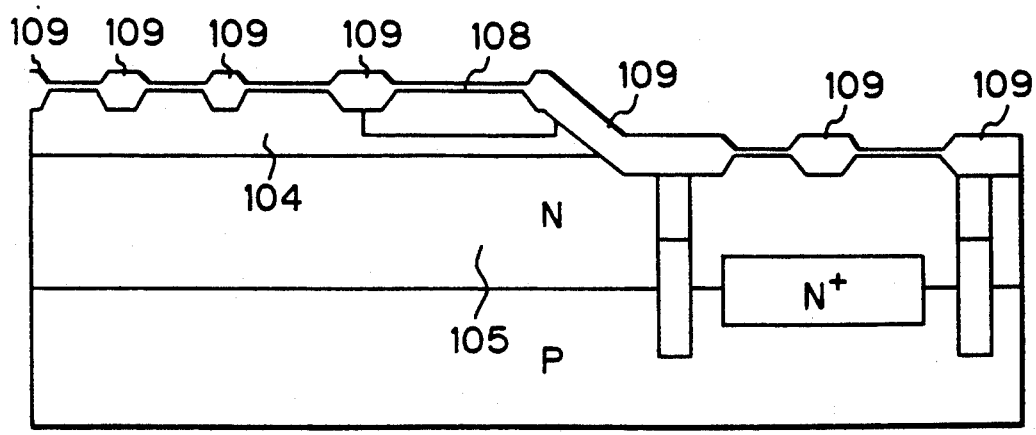

Oxidation is then conducted at about 950° C. for approximately 50 minutes in an O$_2$ atmosphere, whereby, as shown in FIG. 1(f), an SiO$_2$ film 108 of about 300 Å is formed on the surfaces of the epitaxial layers 104,105. An Si$_3$N$_4$ film (not shown) is subsequently formed to about 2,000 Å on the SiO$_2$ film 108 by CVD. A known photolithographic process is then applied to the Si$_3$N$_4$ film so that the Si$_3$N$_4$ film located on the element-forming regions is allowed to remain but the Si$_3$N$_4$ film on the element-isolating regions, where no elements are to be formed, is removed. Subsequent oxidation at 1,000° C. for 200 minutes or so in a steam atmosphere forms isolating oxide films 109 of about 8,000 Å on the epitaxial layers 104,105 at areas corresponding to the respective element-isolating regions. The Si$_3$N$_4$ is then removed in its entirety.

As is illustrated in FIG. 1(g), using a general technique such as that disclosed on pages 37-38 of "1989 Symposium on VLSI Technology" referred to above, an NPN transistor 110 is formed in the NPN-transistor-forming region of the N-type epitaxial layer, a PMOS transistor 111 is the N-type well layer 106 (i.e., the PMOS-transistor-forming region) of the P-type epitaxial layer 105, as well as an NMOS transistor 112 and EPROM 113 in regions of the P-type epitaxial layer 105, said regions being other than the N-well layer, (i.e, the NMOS-transistor-forming region and EPROM-forming region). As a result, a BIMOS device has been completed. In the first example, the distance between a base 114 of the NPN transistor 110 and the N+ buried layer 102 is about 8 μm and a collector-to-emitter voltage of 40-60 V is obtained.

Figure 2A:
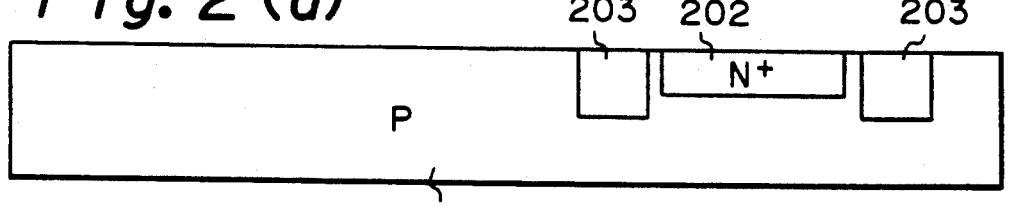
FIGS. 2(a) to 2(t) are cross sections illustrating fabrication steps according to a second example of the present invention.
Figure 2B:
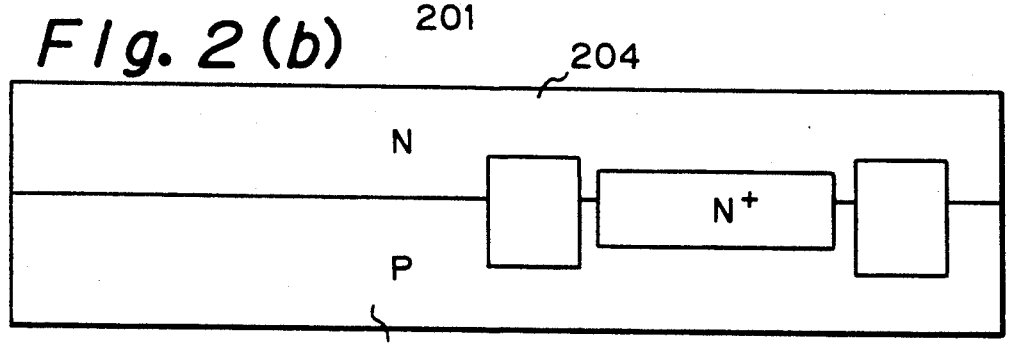
Figure 2C:
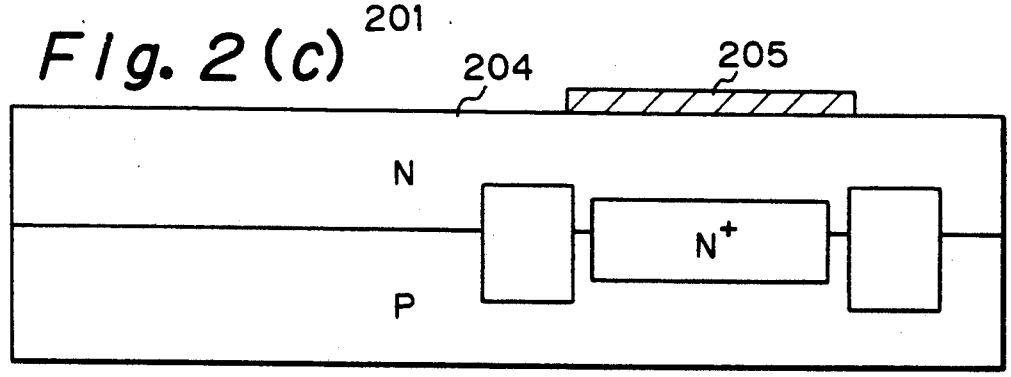
Figure 2D:
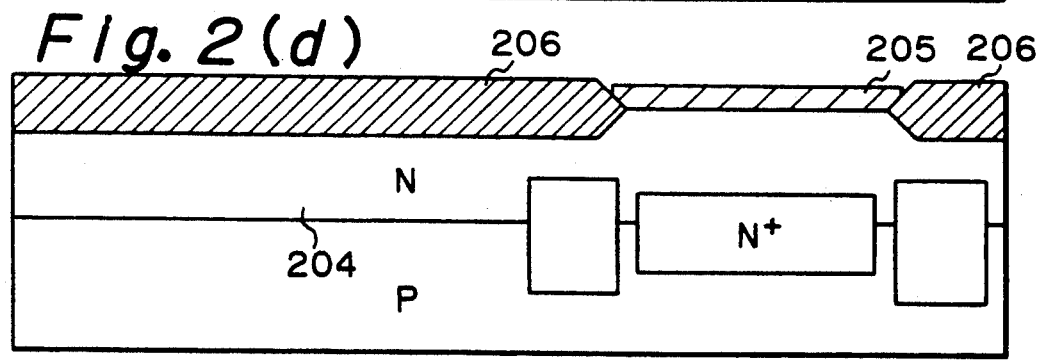
Figure 2E:
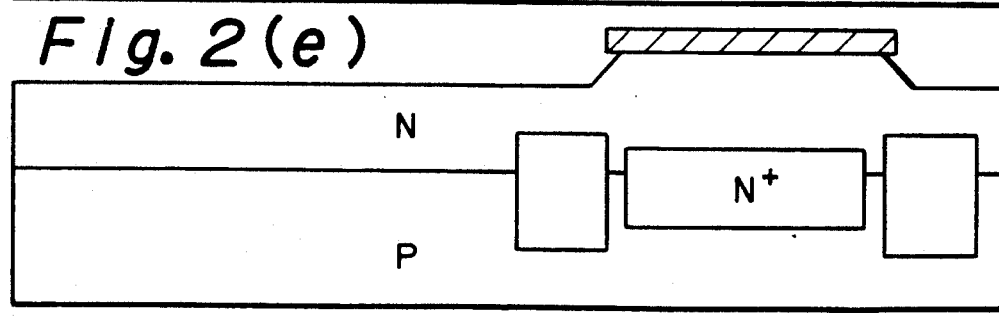
Figure 2F:
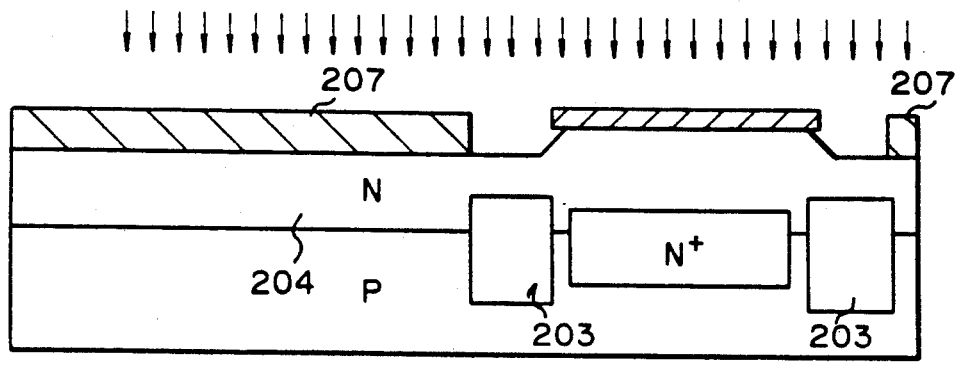
Figure 2G:
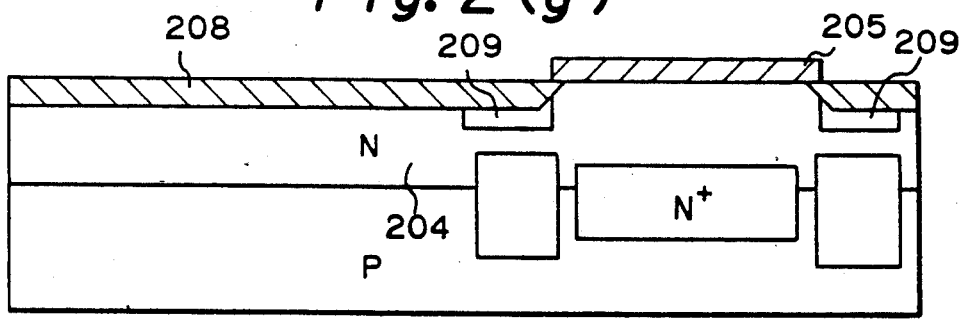
Figure 2H:
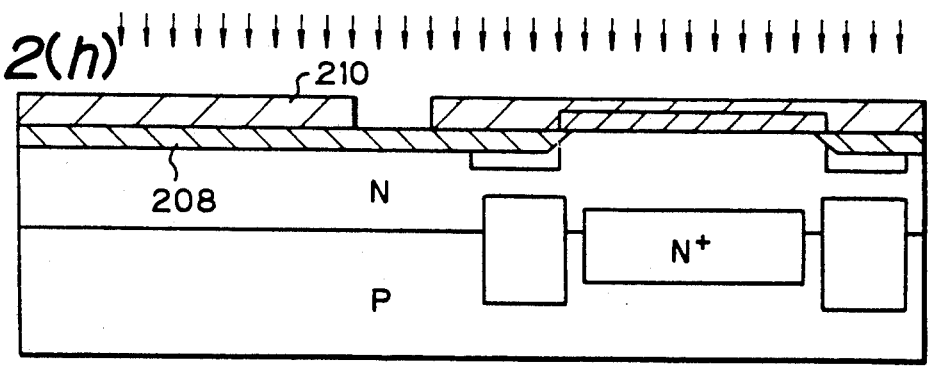
Figure 2I:
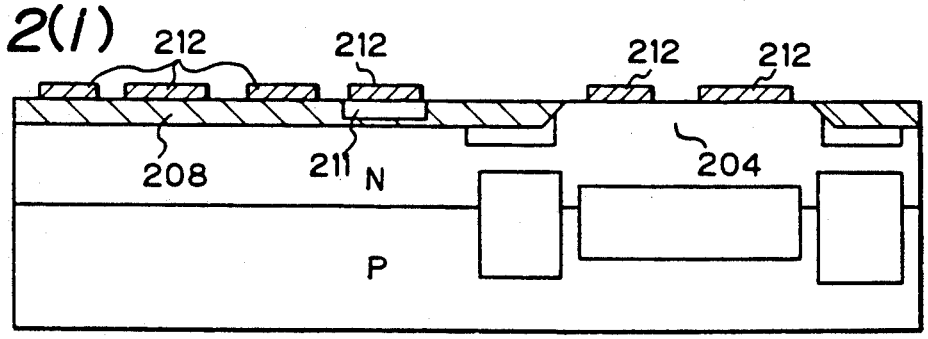
Figure 2J:
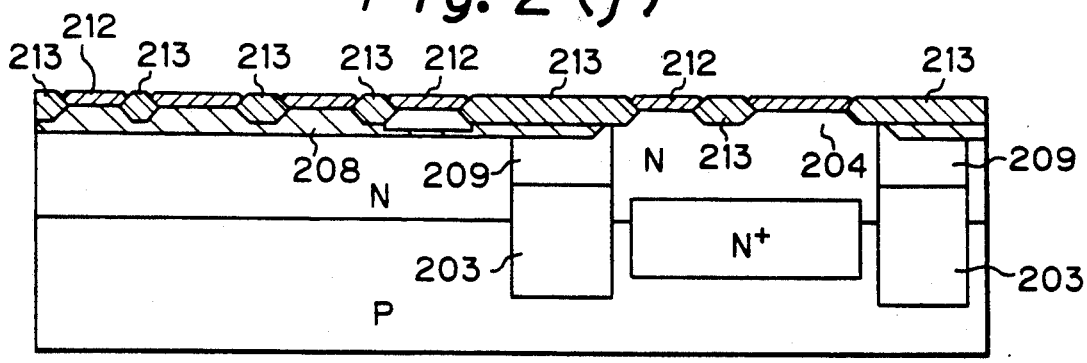
Figure 2K:
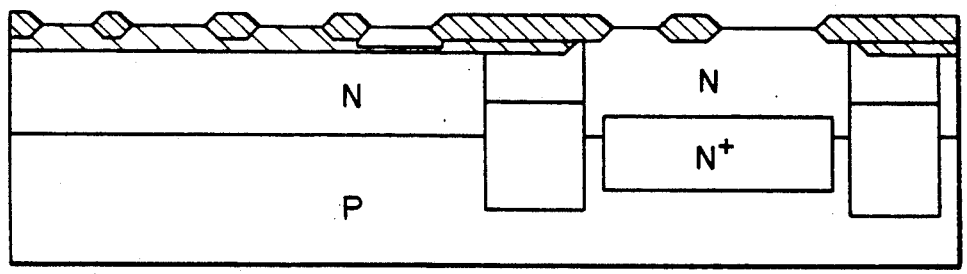
Figure 2L:
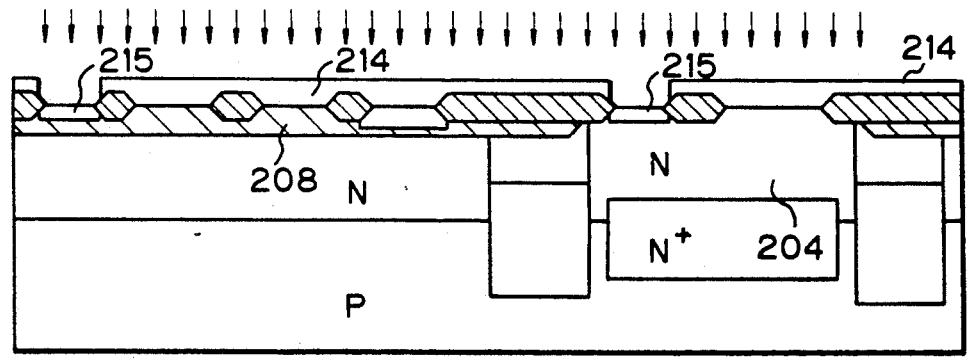
Figure 2M:
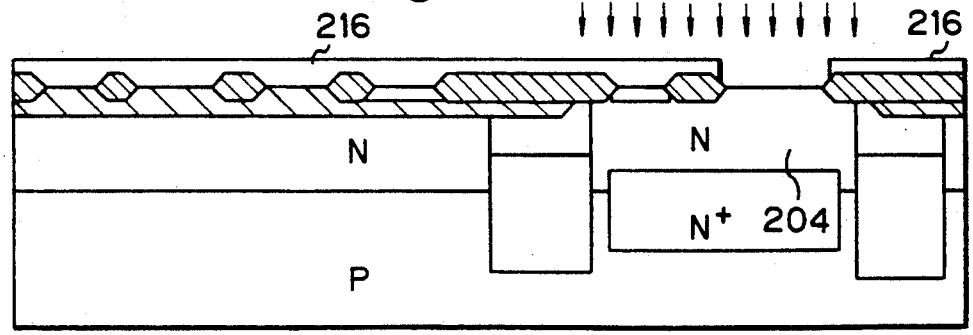
Figure 2N:
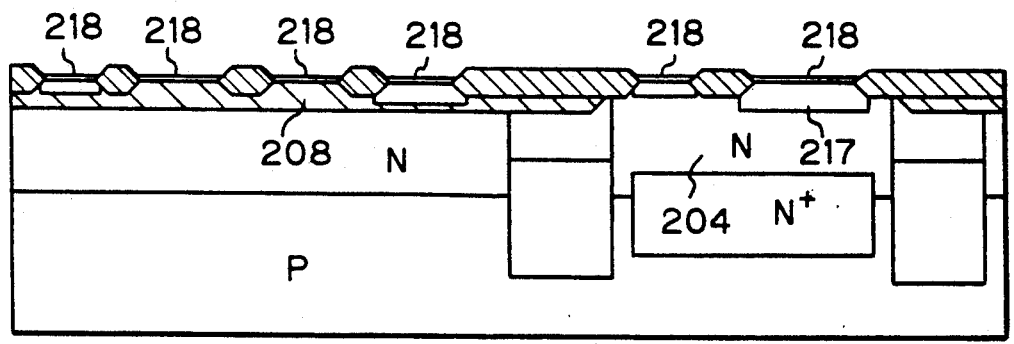
Figure 2O:
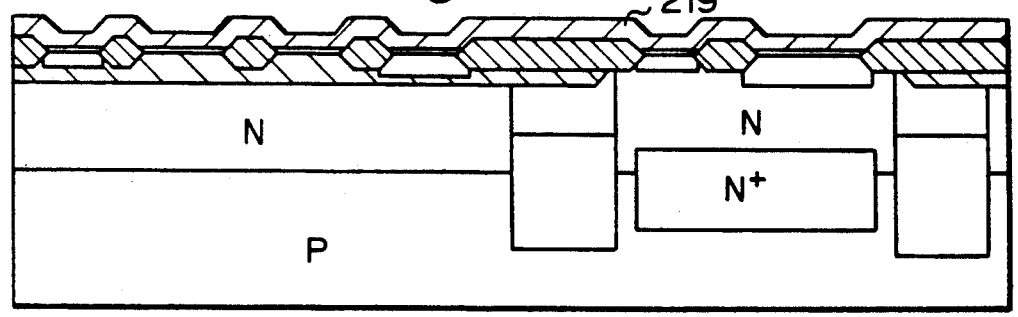
Figure 2P:
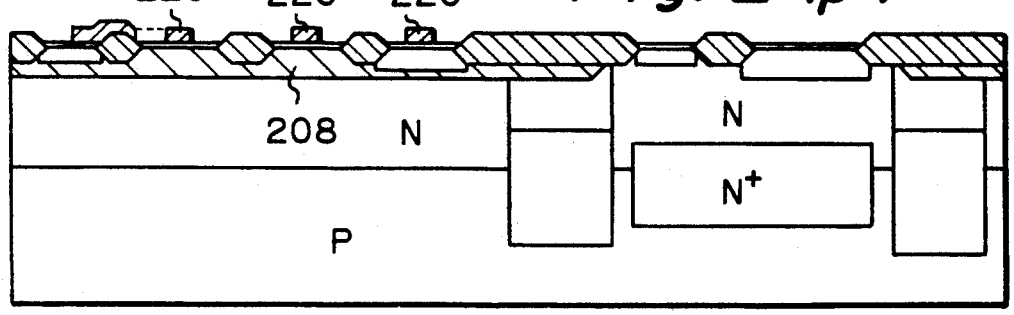
Figure 2Q:
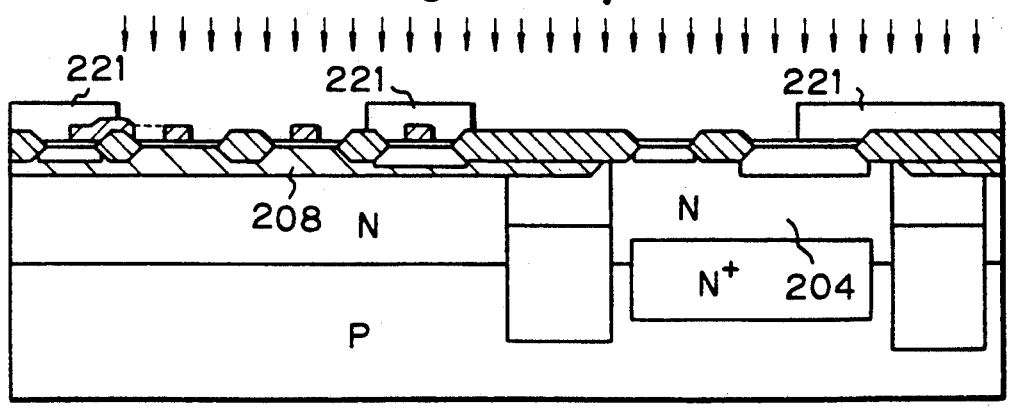
Figure 2R:
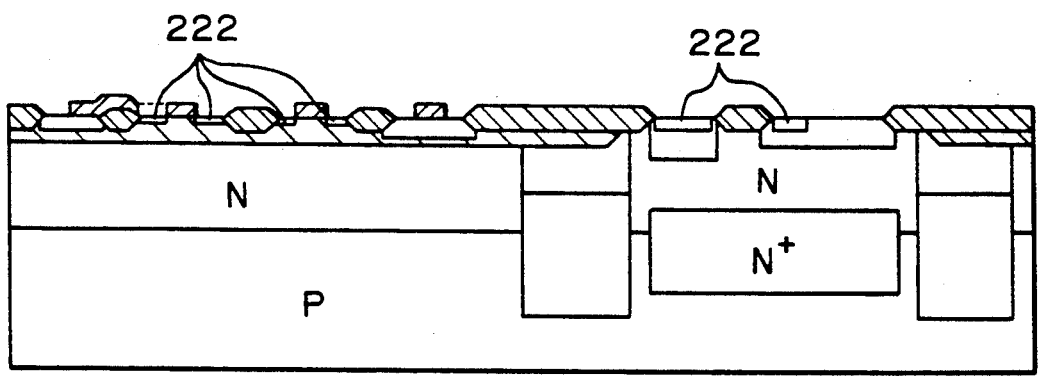
Figure 2S:
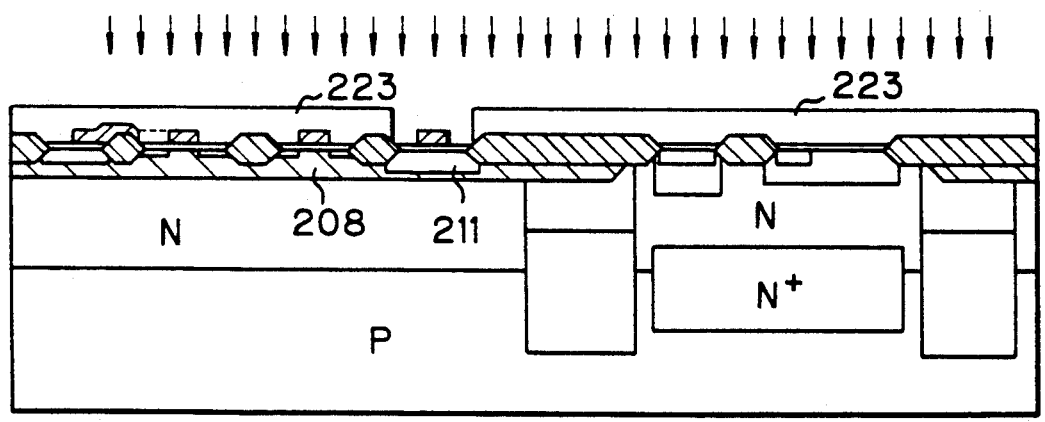
Figure 2T:
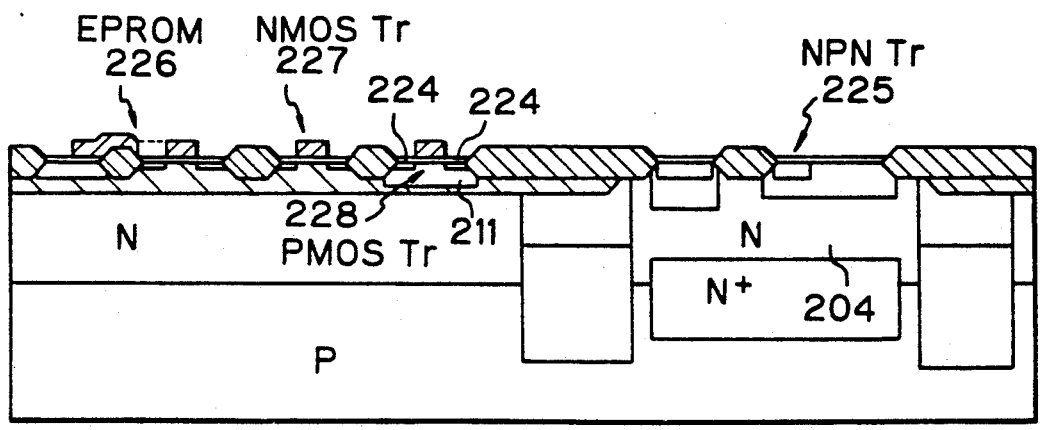

Referring next to FIGS. 2(a) to 2(t), the fabrication steps according to the second example will be described. As opposed to the formation of two element-forming regions by etching as shown in FIG. 1(d) of the first example, the second example makes use of a selective epitaxial process to selectively form a P-type epitaxial layer on an N-type epitaxial layer so that a surface defined by the surface of the P-type epitaxial layer becomes flush relative to a surface of the N-type epitaxial layer.

Firstly, as illustrated in FIG. 2(a), an N+ buried layer 202 whose sheet resistance and junction depth are approximately 30 Ω/□ and 5 μm, respectively, is formed in an NPN-transistor-forming region of a P-type Si substrate having a resistivity of 15Ω.cm or so by the process used in Example 1. To electrically isolate the above-described NPN-transistor-forming region from MOS-transistor-forming regions (i.e., regions where elements other than the NPN transistor is to be formed) vice versa, P+ buried layers 203 whose sheet resistance and junction depth are approximately 300 Ω/□ and 2 μm, respectively, are formed in the P-type Si substrate 201.

As is illustrated in FIG. 2(b), an N-type epitaxial layer 204 made of N-type silicon and having a resistivity of about 5Ω.cm and a thickness of about 10 μm is formed at 1,000° C. on the entire upper surface of the P-type Si substrate 201 by an epitaxial process in which SiH$_2$Cl$_2$ gas is used.

A nitride film 205 of about 3,000 Å is next formed by photolithographic etching on the N-type epitaxial layer 204 at an area corresponding to the NPN-transistor-forming region, as shown in FIG. 2(c).

Following a known high-pressure oxidation process, conventional LOCOS (local oxidation of silicon) is conducted at 6 atm and 1,030° C. for 400 minutes in a wet $O_2$ atmosphere, whereby, as depicted in FIG. 2(d), field oxide films 206 are formed to about 4 μm on the surface of the N-type epitaxial layer 204 at areas other than the NPN-transistor-forming regions.

Using a known etching technique, the field oxide films 206 are next removed as depicted in FIG. 2(e).

A resist resin 207 is then patterned to expose the N-type epitaxial layer at regions located above the P+ buried layers 203 as illustrated in FIG. 2(f). Using the thus-patterned resist resin as a mask, a P-type dopant is doped into the N-type epitaxial layer 204 at 100 keV and $5 \times 10^{12}$ ions/cm$^2$ or so by ion implantation.

The resist resin 207 is then stripped off. Selective epitaxial growth is next conducted at 100 torr and 900° C. or so, whereby, as illustrated in FIG. 2(g), a P-type epitaxial layer 208 made of P-type silicon and having a resistivity of about 2 Ω.cm and a thickness of approximately 4 μm is formed on the recessed surface of the N-type epitaxial layer 204 at regions other than the NPN-transistor forming region which is covered by the nitride film 205. Here, the P-type epitaxial layers 208 are allowed to grow so that the surfaces of the P-type epitaxial layer 208 become flush relative to the interface between the nitride film 205 and the N-type epitaxial layer 204. In addition, by the heat applied during the epitaxial growth, P-type isolation layers 209 are formed in the regions in which the P-type dopant was implanted in FIG. 2(f).

A resist resin 210 is next patterned to expose, as shown in FIG. 2(h), the P-type epitaxial layer 208 at a region where a PMOS transistor is to be formed. Using the resist resin 210 as a mask, phosphorus ions are implanted into the P-type epitaxial layer 208 at 100 keV and $2 \times 10^{12}$ ions/cm$^2$ or so.

Heat treatment is subsequently applied to form an N-type well layer 211 in the P-type epitaxial layer as depicted in FIG. 2(i), followed by the removal of the resist resin 210 and the nitride film 205. A nitride film 212 is next formed by a known photolithographic process to about 3,000 Å over the entire surface, and a nitride film 212 is patterned by photolithography on the NPN-transistor forming region of the N-type epitaxial layer 204 and also on NMOS-transistor-forming, PMOS-transistor-forming and EPROM-forming regions of the P-type epitaxial layer 208. Accordingly the nitride film 212 is allowed to remain on each of the forming regions.

Field oxidation is next conducted at 1,000° C. for 180 minutes in a wet atmosphere while using the nitride film 212 as a mask, whereby element-isolating oxide films 213 are formed on the surfaces of the epitaxial layers 204,208 as shown in FIG. 2(j). Concurrently with the formation of the oxide films 213, the isolation layers 209 which have been formed beforehand diffuse to the corresponding P+ buried layers 203 so that the electrical isolation of the NPN-transistor forming region and the MOS-transistor-forming region is completed. The nitride film 212 is then removed as depicted in FIG. 2(k).

Next, as is shown in FIG. 2(l), a resist resin 214 is patterned so that the N-type epitaxial layer 204 and the P-type epitaxial layer 208 can be exposed at regions where a collector of an NPN transistor and a control gate of an EPROM are to be formed, respectively.

Using the resist resin 214 as a mask, phosphorus ions are implanted at about 60 keV and about $1 \times 10^{15}$ ions/cm$^2$. As a result, N+ layers 215 are formed as a deep collector and a control gate in the collector-forming region and control-gate-forming region, respectively.

To form a base layer for the NPN transistor, a resist resin 216 is next patterned so that the N-type epitaxial layer can be exposed at a base-forming region as shown in FIG. 2(m). Through the resist resin 216, boron ions are implanted at about 40 keV and about $2 \times 10^{14}$/cm$^2$.

Heat treatment is thereafter conducted at 1,000° C. for 60 minutes in an $N_2$ atmosphere, whereby a base layer 217 is formed as illustrated in FIG. 2(n). Oxidation is then conducted at 1,000° C. or 30 minutes in an $O_2$ atmosphere so that oxide films 218 of about 200 Å are formed on the exposed surface regions (i.e., surfaces of the regions where the elements are to be formed) of the epitaxial layers 204,208.

After polysilicon 219 is formed to 2,000 Å over the entire surface as illustrated in FIG. 2(o), the polysilicon 219 is subjected to patterning by photolithographic etching. As is illustrated in FIG. 2(p), gate electrodes 220 for the PMOS transistor, NMOS transistor and EPROM are formed on the P-type epitaxial layer 208.

A resist resin 221 is then patterned to expose, as shown in FIG. 2(q), the EPROM region and NMOS-transistor-forming region of the P-type epitaxial layer 208 and also the collector/emitter regions of the NPN transistor in the N-type epitaxial layer 204. Using the resist resin 221 as a mask, As ions are implanted at 40 keV and $1 \times 10^{16}$/cm$^2$ or so. After the resist resin 221 is stripped off, heat treatment is conducted at 1,000° C. for 60 minutes in an $N_2$ atmosphere so that, as shown in FIG. 2(r), N+ diffused layers 222 are formed as the sources and drains for the EPROM and NMOS transistor and as the collector and emitter of the NPN transistor.

As is illustrated in FIG. 2(s), a resist resin 223 is patterned to expose the PMOS-transistor-forming region, in other words, the N-type well layer 211 of the P-type epitaxial layer 208. Using this resist resin 223 as a mask, $BF_2$ ions are implanted at 70 keV and $5 \times 10^{15}$ ions/cm$^2$ or so. The resist resin 233 is then stripped off and heat treatment is conducted at 1,000° C. for 30 minutes in an $N_2$ atmosphere, so that a P+ diffused layer 224 is formed in the N-type well layer 211 as the source and drain for the PMOS transistor as shown in FIG. 2(t).

Through the steps described above, an NPN transistor 225 has been completed in the N-type epitaxial layer 204, while EPROM 226, NMOS transistor 227 and PMOS transistor 228 have been completed in the P-type epitaxial layer 208.

Reference is finally made to FIGS. 3(a) to 3(h), which illustrate the fabrication steps according to the third example of the present invention. In the third example, a portion of a P-type epitaxial layer is oxidized, followed by the removal of the oxide film to selectively form the P-type epitaxial layer on an N-type epitaxial layer.

Figure 3A:
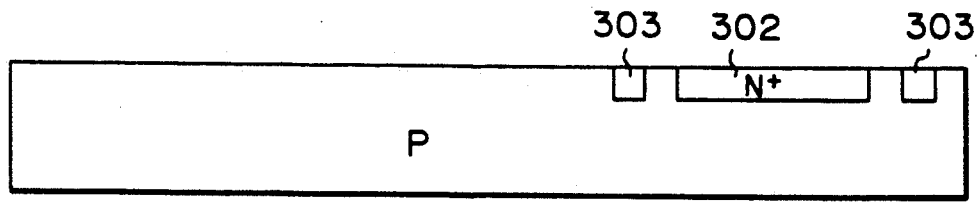

A P-type <100> Si substrate 301 which is shown in FIG. 3(a) and has a resistivity of about 15Ω.cm is subjected to heat treatment at 1,000° C. for 20 minutes in an $O_2$ atmosphere, so that an $SiO_2$ film of about 450 Å (not shown) is formed over the entire surface. A resist resin is then coated on the entire surface, and is patterned by photolithography so that a region where an NPN transistor is to be formed is exposed. Using the resist resin as a mask, antimony ions are introduced into the P-type Si substrate 301 by ions implantation at the acceleration voltage of 40 keV and the dose of 3E 15 ions/cm². The resist resin is then stripped off, followed by the heat treatment approximately at 1,200° C. for 500 minutes in an N₂ atmosphere to form an N+ buried layer 302 in the NPN-transistor-forming region of the substrate 301. The sheet resistance and junction depth of the N+ buried layer 302 are about 30 Ω/□ and 4.5 μm, respectively. A resist resin is next patterned by photolithography to expose regions which will become isolation regions for the NPN transistor. Using the resist resin as a mask, boron ions are implanted into the substrate 301 by ion implantation at the acceleration voltage of 60 keV and the dose of 2E 14 ions/cm². After the resist resin is stripped off, heat treatment is conducted approximately at 1,080° C. for 30 minutes in an N₂ atmosphere so that P+ buried layers 303 having a sheet resistance of about 300 Ω/□ and a junction depth of approximately 1.3 μm are formed in regions of the substrate 301, which regions will act as isolation regions. The SiO₂ film on the surface is then removed in its entirety.

Figure 3B:
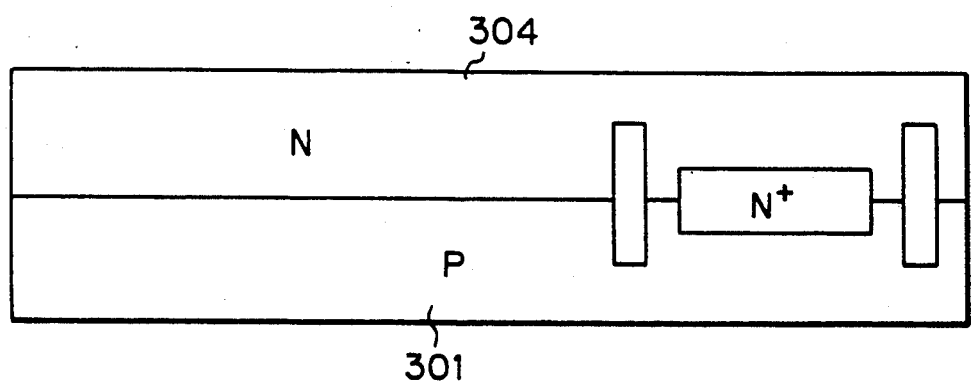

On the entire surface of the substrate 301, an N-type epitaxial layer 304 having a specific resistivity of about 5 Ω.cm and a thickness of about 12 μm is formed by a known epitaxial process. Concurrently with the formation of the N-type epitaxial layer 304, the N+ buried layer 302 and P+ buried layer 303 diffuse into the resulting N-type epitaxial layer 104. The resultant structure is illustrated in FIG. 3(b).

Figure 3C:
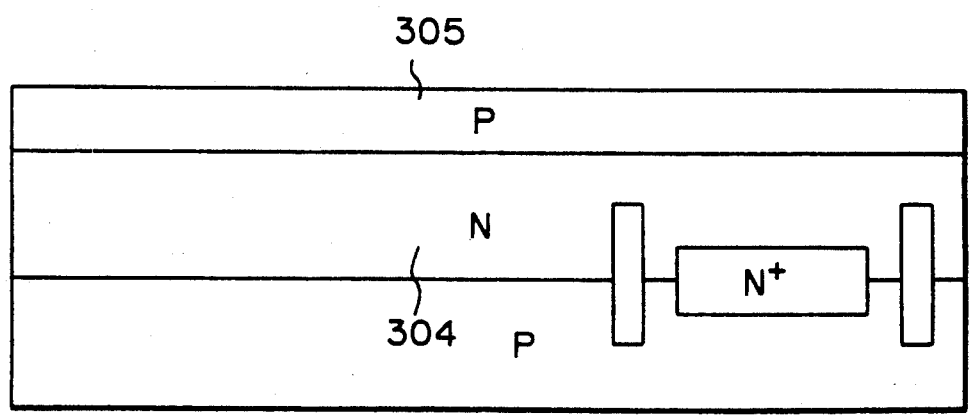

As is illustrated in FIG. 3(c), a P-type epitaxial layer 305 having a specific resistivity of about 2 Ω.cm and a thickness of about 3 μm is formed by a similar process on the N-type epitaxial layer 304.

Figure 3D:
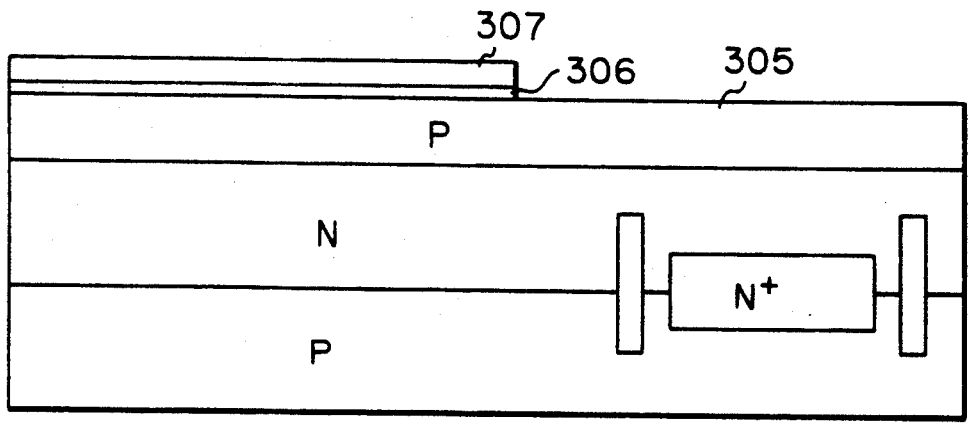

Oxidation is next conducted approximately at 950° C. for 50 minutes in an O₂ atmosphere so that an SiO₂ film 306 of about 300 Å is formed on the entire surface of the P-type epitaxial layer 305 as shown in FIG. 3(d). In addition, an Si₃N₄ film 307 is formed to 2,000 Å or so on the SiO₂ film 306 by CVD. By photolithography, the Si₃N₄ film 307 and SiO₂ film 306 are patterned to expose an NPN-transistor-forming region (including isolation regions) as depicted in FIG. 3(d).

Figure 3E:
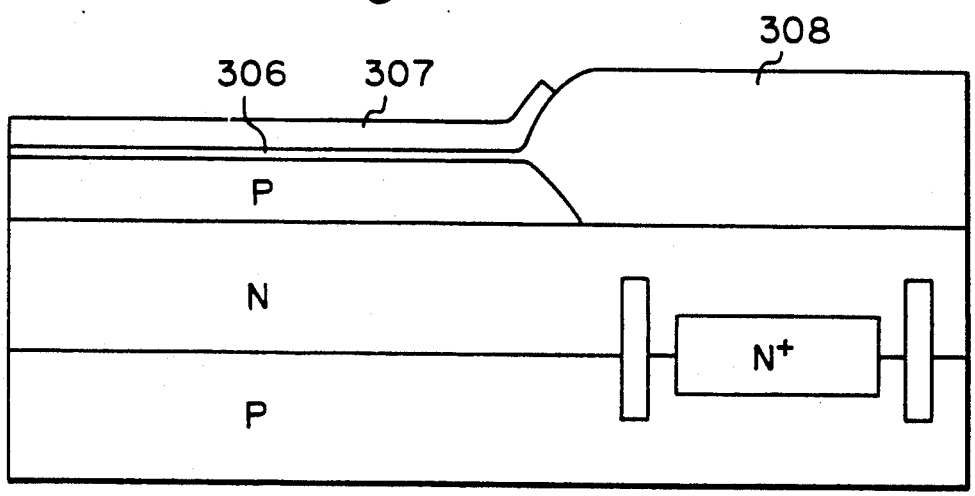

In a wet O₂ atmosphere of 7 atm and 1,030° C., the P-type epitaxial layer 305 is next oxidized at the area not covered by the Si₃N₄ film 307 so that the P-type epitaxial layer 305 is converted there to an oxide film 308 of about 60,000 Å thickness as shown in FIG. 3(e).

Figure 3F:
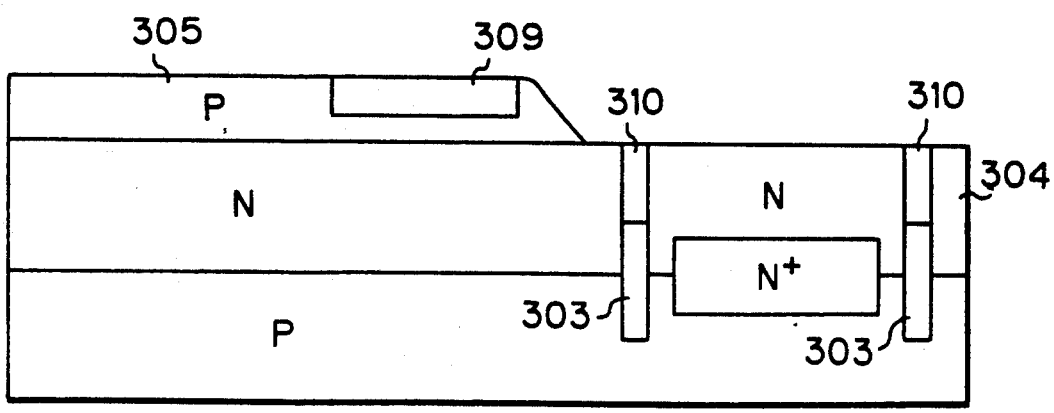

The Si₃N₄ film 307 is then removed by an etching technique. Further, the SiO₂ film 306 and the oxide film 308 are removed wholly. As a result, as is depicted in FIG. 3(f), the NPN-transistor-forming region and the isolation regions are exposed and the P-type epitaxial layer 305 remains in the other regions.

Oxidation is then conducted approximately at 1,000° C. for 5 minutes in a wet O₂ atmosphere, whereby an oxide film (not shown) of about 1,000 Å is formed over the entire surface. By photolithography, a resist resin is patterned so that a PMOS-transistor-forming region, which is a part of the P-type epitaxial layer 305, is exposed. Using the resist resin as a mask, phosphorus ions are introduced into the PMOS-transistor-forming region of the P-type epitaxial layer 305 at an acceleration voltage of about 70 keV and a dose of approximately 1E 13 ions/cm² by ion implantation. After the resist resin is stripped off, a resist resin is patterned by photolithography to expose the NPN-transistor-forming region of the N-type epitaxial layer 304. Using this resist resin as a mask, boron ions are introduced into the NPN-transistor-isolating regions of the N-type epitaxial layer 304 at the acceleration voltage of 100 keV and the dose of 2E 13 ions/cm² by ion implantation. The resist resin is then stripped off, followed by heat treatment at 1,200° C. for 200 minutes or so in an N₂ atmosphere. As a result, as shown in FIG. 3(f), an N-type well 309 whose sheet resistance and junction depth are 1500 Ω/□ and 2.5 μm is formed in the PMOS-transistor-forming region of the P-type epitaxial layer 305. Concurrently with the formation of the N-type well 309, P+ layers 310 are formed in the regions, where NPN-transistor-isolating regions will be formed, of the N-type epitaxial layer 304. The P+ layers 310 are connected to the corresponding P+ buried layers 303 so that the isolation of the NPN-transistor-forming region is completed. Subsequently, the oxide film on the surface is removed in its entirety.

Figure 3G:
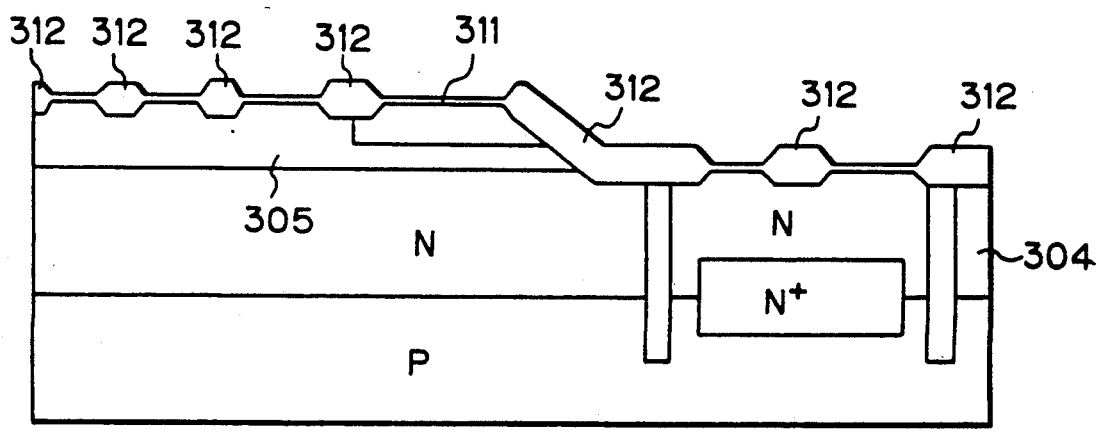

Oxidation is next conducted approximately at 950° C. for 50 minutes in an O₂ layer whereby, as shown in FIG. 3(g), an oxide film 311 of about 300 Å is formed on the surfaces of the epitaxial layers 304,305. An Si₃N₄ film (not shown) is further formed by CVD to about 2,000 Å on the oxide film 311. By photolithography, the Si₃N₄ film located on the element-forming regions only is allowed to remain but the Si₃N₄ film on the element-isolating regions, where no elements are to be formed, is removed. Subsequent oxidation at 1,000° C. for 200 minutes or so in a wet O₂ atmosphere forms isolating oxide films 312 of about 8,000 Å on the surfaces of the epitaxial layers 304,305 at areas corresponding to the respective element-isolating regions. The Si₃N₄ is then removed in its entirety.

As is shown in FIG. 3(h), by a conventional technique, for example, such that disclosed on pages 37–38 of "1989 Symposium on VLSI Technology", an NPN transistor 313 is formed in the NPN-transistor-forming region of the N-type epitaxial layer 304, a PMOS transistor 314 in the N-type well layer 309 (i.e., the PMOS-transistor-forming region) of the P-type epitaxial layer 305, and an NMOS transistor 315 and EPROM 316 in regions (i.e., the NMOS-transistor-forming region and EPROM-forming region) of the P-type epitaxial layer 305 other than the N-type well layer. Through the above steps, a BIMOS device has been completed.

Although NMOS transistor, PMOS transistor (CMOS transistor) and EPROM were formed in the P-type epitaxial layer in the above examples, other elements can also be formed.

As has been described in detail, an epitaxial layer is formed as a two-layer structure, one being an N-type epitaxial layer and the other a P-type epitaxial layer, and an NPN transistor is formed in the N-type epitaxial layer while other elements such as a CMOS transistor and EPROM are formed in the P-type epitaxial layer. It is therefore unnecessary to form a well in the N-type epitaxial layer in which the NPN transistor is formed. A well is hence required only at the region of each PMOS transistor in the P-type epitaxial layer. It is thus unnecessary to form deep wells, so that the degree of heat treatment can be reduced. Upward diffusion of each buried layer, which takes place by such heat treatment, can therefore be minimized. This leads to an increase in the distance between each buried layer and the base of the associated bipolar transistor, whereby the collector-to-emitter voltage of the NPN transistor can be increased.

It is also possible to improve the controllability of the collector-to-emitter voltage of the NPN transistor because the distance between the buried layer and the base of the bipolar transistor is practically governed by the thickness of the underlying N-type epitaxial layer.

As is understood from the foregoing, the present invention makes it possible to form an NPN transistor together with one or more other elements on the same substrate while making the collector-to-emitter voltage of the NPN transistor higher and also improving the controllability of its withstandable voltage.

What is claimed is:

1. A process for the fabrication of a BIMOS device with at least one bipolar transistor and at least one MOS transistor formed on a major surface of a semiconductor substrate of a first conductivity type, which comprises the following steps:
   (a) forming a heavily-doped, buried layer of a second conductivity type in a first region of the semiconductor substrate, said first region including a part of the major surface and being located adjacent to said part of said major surface;
   (b) forming an epitaxial layer of the second conductivity type on the semiconductor substrate, including causing the buried layer of the second conductivity type to extend close to the major surface of the semiconductor substrate inside the epitaxial layer of the second conductivity type;
   (c) forming an epitaxial layer of a first conductivity type on the epitaxial layer of the second conductivity type;
   (d) exposing a surface of the epitaxial layer of the second conductivity type, said surface being located right above the first region;
   (e) forming said at least one bipolar transistor in a second region of the epitaxial layer of the second conductivity type, said second region including said surface of said epitaxial layer and being located adjacent to said surface of said epitaxial layer of the second conductivity type; and
   (f) forming said at least one MOS transistor in a third region of the epitaxial layer of the first conductivity type, said third region including a part of a surface of the epitaxial layer of the first conductivity type and being located adjacent to the part of the surface of the epitaxial layer of the first conductor.

2. The process of claim 1, wherein the semiconductor substrate is made of silicon.

3. The process of claim 1, wherein the epitaxial layers of the first and second conductivity types are each formed of silicon.

4. The process of claim 1, wherein the surface-exposing step (d) comprises the following sub-steps:
   (d-1) forming an etching resistant layer on the epitaxial layer of the first conductivity type so that the epitaxial layer of the first conductivity type is exposed right above the first region; and
   (d-2) etching with an alkaline etchant the epitaxial layer of the first conductivity type through the etching resistant layer as a mask, whereby the epitaxial layer of the second conductivity type is exposed.

5. The process of claim 4, wherein an edge portion of the epitaxial layer of the first conductivity type extends at an angle of 54.7° relative to an interface between the epitaxial layer of the second conductivity type and the epitaxial layer of the first conductor layer.

6. The process of claim 4, wherein the alkaline etchant is KOH.

7. The process of claim 4, wherein the alkaline etchant is NaOH.

8. The process of claim 4, wherein the etching resistant layer is formed of a resist resin.

9. A process for the fabrication of a BIMOS device with at least one bipolar transistor and at least two MOS transistors formed on a major surface of a semiconductor substrate of a first conductivity type, which comprises the following steps:
   (a) forming a heavily-doped, buried layer of a second conductivity type in a first region of the semiconductor substrate, said first region including a part of the major surface and being located adjacent to said part of said major surface;
   (b) forming an epitaxial layer of the second conductivity type on the semiconductor substrate, including causing the buried layer of the second conductivity type to extend close to the major surface of the semiconductor substrate inside the epitaxial layer of the second conductivity type;
   (c) oxidizing the epitaxial layer of the second conductivity type at a surface thereof and in a portion adjacent to the surface while using the oxidation resistant layer as a mask;
   (d) stripping the thus-oxidized epitaxial layer of the second conductivity type to expose the epitaxial layer of the second conductivity type;
   (e) forming an epitaxial layer of a first conductivity type on the thus-exposed epitaxial layer of the second conductivity type so that a surface of the epitaxial layer of the first conductivity type lies in the same plane as an interface between the oxidation resistant layer and the epitaxial layer of the second conductivity type;
   (f) stripping the oxidation resistant layer;
   (g) forming said at least one bipolar transistor in a second region of the epitaxial layer of the second conductivity type right above the first region, said second region including a part of the surface of the epitaxial layer of the second conductivity type and being located adjacent to said part of said surface of the epitaxial layer of the second conductivity type;
   (h) forming one of said at least two MOS transistors in a second region of the epitaxial layer of the first conductivity type, said second region of the epitaxial layer of the first conductivity type including a part of said surface of the epitaxial layer of the first conductivity type and being located adjacent to said part of said surface of the epitaxial layer of the first conductivity type; and
   (i) forming the other one of said at least two MOS transistors in a third region of the epitaxial layer of the first conductivity type, said third region including another part of said surface of the epitaxial layer of the first conductivity type and being located adjacent to said another part of said surface of the epitaxial layer of the first conductivity type.

10. The process of claim 9, wherein the semiconductor substrate is made of silicon.

11. The process of claim 9, wherein the epitaxial layers of the first and second conductivity types are each formed of silicon.

12. The process of claim 9, wherein the oxidation resistant layer is made of $Si_3N_4$.

* * * * *